United States Patent
Ballance et al.

[11] Patent Number: 5,820,923
[45] Date of Patent: Oct. 13, 1998

[54] CURING SILICA PRECURSORS BY EXPOSURE TO NITROUS OXIDE

[75] Inventors: David Stephen Ballance; Loren Andrew Haluska; Mark Jon Loboda, all of Midland, Mich.

[73] Assignee: Dow Corning Corporation, Midland, Mich.

[21] Appl. No.: 970,450

[22] Filed: Nov. 2, 1992

[51] Int. Cl.$^6$ .................................................. B05D 5/12
[52] U.S. Cl. ................ 427/126.2; 427/226; 427/240; 427/421; 427/387; 427/430.1; 427/379; 427/420
[58] Field of Search .................. 427/126.2, 226, 427/240, 376.2, 387, 421, 420, 430.1, 379

[56] References Cited

U.S. PATENT DOCUMENTS

| | | | |
|---|---|---|---|
| 4,239,811 | 12/1980 | Kemlage | 427/95 |
| 4,749,631 | 6/1988 | Haluska et al. | 428/704 |
| 4,842,888 | 6/1989 | Halluska et al. | 427/38 |
| 5,112,676 | 5/1992 | Cot | 427/226 |
| 5,116,637 | 5/1992 | Baney et al. | 427/340 |

*Primary Examiner*—Janyce Bell
*Attorney, Agent, or Firm*—Roger E. Gobrogge

[57] ABSTRACT

Silica-containing ceramic coatings are produced on substrates at low temperatures by applying a coating comprising a silica precursor on a substrate and heating the coated substrate under an environment comprising nitrous oxide at a temperature sufficient to convert the silica precursor to the silica-containing ceramic coating. This method is especially valuable for forming protective and dielectric coatings on electronic devices.

11 Claims, No Drawings

CURING SILICA PRECURSORS BY EXPOSURE TO NITROUS OXIDE

BACKGROUND OF THE INVENTION

The present invention relates to a method of forming silica-containing ceramic coatings on substrates such as electronic devices. These coatings can be used to provide hermetic protection to the underlying substrate or they can be used as dielectric layers.

The use of silica coatings derived from resinous precursors on substrates such as electronic devices is known in the art. For instance, Haluska et al. in U.S. Pat. No. 4,749,631 disclose a process for forming silica-containing coatings on substrates such as electronic devices. The process described therein involves applying a solution of partially hydrolyzed silicate ester to a substrate followed by heating the coated substrate in air at a temperature in the range of 200°–1000° C. Since temperatures in the range of 600°–800° C. are required for complete conversion of the silicate ester to silica, the method has limited utility when temperature sensitive substrates such as electronic devices are to be coated.

Other methods for converting resinous silica precursors to silica-containing materials at lower -temperatures are also known in the art. For instance, U.S. Pat. No. 4,842,888 describes the conversion of partially hydrolyzed silicate ester and metal oxide containing materials to nitrified silica-metal oxide containing ceramics by heating in ammonia. Similarly, U.S. Pat. No. 5,116,637 describes the use of amines to assist in the conversion of various silica precursors to silica-containing materials. These processes, however, are disadvantageous in that the agents used in the conversion have drawbacks such as corrosivity and disposal concerns which limit their use in the electronics industry.

The use of nitrous oxide in various chemical vapor deposition techniques is also known in the art. For instance, Kemlage in U.S. Pat. No. 4,239,811 teaches a low pressure vapor deposition method which deposits a silicon dioxide coating by reacting monomeric chlorosilanes with nitrous oxide in the presence of oxygen. Such techniques, however, involve the conversion of gaseous monomeric silanes into silica coatings.

Ballance et al. in U.S. patent application Ser. No. 07/912, 436, filed Jul. 13, 1992. and assigned to the same assignee hereof, describe converting hydrogen silsesquioxane resin to silica with nitrous oxide. This application, however, is limited to silica precursors which are not within the scope of this invention.

The present invention describes the use of nitrous oxide to convert various silica precursors to silica-containing coatings at low temperatures.

SUMMARY OF THE INVENTION

The present invention relates to a method of forming a silica-containing ceramic coating on a substrate. The method comprises first applying a silica precursor coating comprising hydrolyzed or partially hydrolyzed $R_nSi(OR)_{4-n}$ on the substrate, in which each R is independently an aliphatic, alicyclic or aromatic substituent of 1–20 carbon atoms and n is 0–3. The coated substrate is then heated in an atmosphere containing nitrous oxide at a temperature sufficient to convert the coating to a silica-containing ceramic coating. This method is especially valuable for forming coatings on electronic devices.

DETAILED DESCRIPTION OF THE INVENTION

The present invention describes the use of nitrous oxide ($N_2O$) to accelerate the conversion of silica precursors to silica-containing coatings at low temperatures. This invention has an impact on the use of silica precursors for coating temperature sensitive substrates such as electronic devices since it avoids various problems with prior art conversion processes and agents. Such problems have included explosion and environmental concerns, the use of elevated temperatures, corrosivity of the curing agents, cracking and modification of the coating and availability of materials.

Because the process of the present invention avoids these disadvantages, they are particularly valuable for the deposition of coatings on substrates such as electronic devices or electronic circuits which are temperature sensitive and which require high quality coatings. Such coatings could serve, for example, as protective or dielectric coatings, interlevel dielectric layers, doped dielectric layers to produce transistor like devices, pigment loaded binder systems containing silicon to produce capacitor and capacitor like devices, multilayer devices, 3-D devices, silicon on insulator devices, coatings for superconductors, super lattice devices and the like. The choice of substrates to be coated by the instant invention, however, is limited only by the need for thermal and chemical stability of the substrate under the conditions used. It is also contemplated, therefore, that the process of the invention could be used on non-electronic substrates such as plastics including, for example, polyimides, epoxies, polytetrafluoroethylene and copolymers thereof, polycarbonates, acrylics, polyesters and the like.

As used in the present invention, the expression "silica-containing ceramic" is meant to include both amorphous silica ($SiO_2$) materials as well as amorphous silica-like materials that are not fully free of residual carbon, silanol (Si—OH) and/or hydrogen and which may contain additional ceramic materials. Such silica-containing ceramic materials may have variable densities depending on the temperature and time of heating. The expressions "electronic device" or "electronic circuit" include, but are not limited to, silicon based devices, gallium arsenide based devices, focal plane arrays, opto-electronic devices, photo-voltaic cells and optical devices.

In the present invention, a silica-containing ceramic coating is formed on a substrate by a process which comprises coating the substrate with a silica precursor composition comprising hydrolyzed or partially hydrolyzed $R_nSi(OR)_{4-n}$ and then heating the coated substrate in an environment comprising nitrous oxide.

The silica precursor material useful herein includes hydrolyzed or partially hydrolyzed compounds of the formula $R_nSi(OR)_{4-n}$, in which each R is independently an aliphatic, alicyclic or aromatic substituent of 1–20 carbon atoms, preferably 1–4, such as an alkyl (eg. methyl, ethyl, propyl), alkenyl (eg. vinyl or allyl), alkynyl (eg. ethynyl), cyclopentyl, cyclohexyl, phenyl etc., and n is 0–3, preferably 0 or 1. Some of these materials are commercially available, for example, under the tradename ACCUGLASS. Specific compounds of this type include, for example, methyltriethoxysilane, phenyltriethoxysilane, diethyldiethoxysilane, methyltrimethoxysilane, dimethyldimethoxysilane, phenyltrimethoxysilane, vinyltrimethoxysilane, tetrametlioxysilane, tetraethoxysilane, tetrapropoxysilane, and tetrabutoxysilane. After hydrolysis or partial hydrolysis of these compounds, the silicon atoms therein may be bonded to C, OH or OR groups, but a substantial portion of the material is believed to be condensed in the form of soluble Si—O—Si resins. Compounds in which x=2 or 3 are generally not used alone as volatile cyclic structures are generated during pyrolysis, but small amounts of said compounds may be cohydrolyzed with other silanes to prepare useful preceramic materials.

The above silica precursor coating material may also contain other ceramic oxide precursors. Examples of such ceramic oxide precursors include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed, at relatively low temperatures and relatively rapid reaction rates to form ceramic oxide coatings.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, or other organic groups bonded to said metal or non-metal through an oxygen such as acetylacetonate. Specific compounds, therefore, include zirconium tetracetylacetonate, titanium dibutoxy diacetylacetonate, aluminum triacetylacetonate and tetraisobutoxy titanium.

When the silica precursor is to be combined with one of the above ceramic oxide precursors, generally it is used in an amount such that the final ceramic coating contains 70 to 99.9 percent by weight $SiO_2$.

According to the process of the invention, the above silica precursor and, optionally, any ceramic oxide precursors are applied to the surface of a substrate. This can be accomplished in any manner, but a preferred method involves dissolving the silica precursor in a solvent to form a solution or dispersion which is applied to the surface of the substrate. Various facilitating measures such as stirring and/or heating may be used to dissolve or disperse the silica precursor and create a more uniform application solution. Solvents which may be used include any agent or mixture of agents which will dissolve or disperse the silica precursor to form a homogenous solution without affecting the resultant coating. These solvents can include, for example, alcohols such as ethyl or isopropyl, aromatic hydrocarbons such as benzene or toluene, alkanes such as n-heptane or dodecane, ketones, esters, glycol ethers, or cyclic dimethylpolysiloxanes, in an amount sufficient to dissolve the above materials to low solids. Generally, enough of the above solvent is used to form a 0.1–50 weight percent solution.

If a solution method is used, the solution comprising the silica precursor, solvent, and, optionally, a modifying ceramic oxide precursor is then coated onto the substrate. The method of coating can be, but is not limited to, spin coating, dip coating, spray coating or flow coating. Other equivalent means, however, are also deemed to be within the scope of this invention.

The solvent is then allowed to evaporate from the coated substrate resulting in the deposition of a silica precursor coating. Any suitable means of evaporation may be used such as simple air drying by exposure to an ambient environment, by the application of a vacuum or mild heat (eg., less than 50° C.) or during the early stages of the heat treatment. It is to be noted that when spin coating is used, the additional drying period is minimized as the spinning drives off the solvent.

Once the silica precursor coating is applied, it is then heated in an environment containing nitrous oxide at a temperature sufficient to convert it to a silica-containing material. During this conversion, factors such as nitrous oxide gas concentration, gas exposure time, temperature and heating time all need to be controlled.

The nitrous oxide used in this process is known in the art and commercially available. It may be used in this invention in its neat form or it may be diluted in additional gases (eg., inert gases such as argon, nitrogen, etc. or reactive gases such as air, ammonia, amines, etc.) to a concentration sufficient to convert the silica precursor to silica at a desirable rate under the temperature conditions chosen.

The silica precursor coating is generally exposed to this gas for a time sufficient to convert the silica precursor to silica. Generally, times in the range of several minutes to several hours are useful (eg., 2 minutes to 2 hours). This exposure can occur during the ramp-up, during the heat soak or during ramp-down.

As noted above, it is also contemplated herein that the silica precursor may be concomitantly or sequentially exposed to other reactive gases which assist in conversion. For instance, it is within the scope of this invention to also expose the silica precursor to moisture (eg., steam), ammonia, amines, other oxidizing gases and the like.

Generally, the temperatures useful herein are in the range of about 100° C. to about 600° C. Higher and lower temperatures, however, are also contemplated in the invention. For example, lower temperatures may be used but they often result in incomplete conversion of the silica precursor and insufficient densification of the ceramic. Similarly, higher temperatures (eg., 1000° C.) may be used but the need for nitrous oxide is diminished since the silica precursors can generally be converted to silica at such temperatures in air.

Generally, the coated substrates are heated under the nitrous oxide containing environment for a time sufficient to convert the silica precursor to silica. Time periods in the range of a few minutes for very thin films to several hours for very thick films, depending on the temperature, are generally useful herein. It is particularly preferred to heat the coated substrates at a temperature of about 200°–500C for about 1–3 hours.

Any method of heating such as the use of a quartz tube furnace, a convection oven, reverse direction processing as described in U.S. patent application Ser. No. 07/633,707, now allowed and assigned to the same assignee hereof, or radiant or microwave energy is generally functional herein. Similarly, the rate of heating is generally not a critical factor, but it is most practical and preferred to heat the substrate as rapidly as possible.

By the above methods a thin (less than 2 microns) silica-containing ceramic planarizing coating is produced on the substrate. The coating smooths the irregular surfaces of various substrates and has excellent adhesive properties. In addition, the coating may be covered by other coatings such as additional $SiO_2$ layers, silicon containing coatings, silicon carbon containing coatings, silicon nitrogen containing coatings, silicon oxygen nitrogen containing coatings and/or silicon nitrogen carbon containing coatings. Such multiple layer coatings are known in the art and many are described in U.S. Pat. No. 4,756,977 which is hereby incorporated by reference.

Coatings produced by the instant invention possess low defect density and are useful on electronic devices as protective coatings, as corrosion resistant and abrasion resistant coatings, as temperature and moisture resistant coatings, as dielectric layers and as a diffusion barrier against ionic impurities such as sodium and chloride.

The following non-limiting Examples are provided so that one skilled in the art may more readily understand the invention.

EXAMPLE 1

A 1 inch square silicon wafer was spin coated with a 10 wt. % solution of partially hydrolyzed ethylorthosilicate in isopropyl alcohol and n-Butanol solvents at a spin speed of 3000 RPM for 20 seconds. The coated wafer was heated to 350° C. for 3 hours in an environment comprising 100% nitrous oxide. FTIR analysis after the heat treatment showed only a trace of SIOH remained. The coating thickness was 2888 angstroms and the refractive index was 1.452 at 405 nm.

EXAMPLE 2

A 1 inch square silicon wafer was spin coated with a 10 wt. % solution of partially hydrolyzed ethylorthosilicate in isopropyl alcohol and n-butanol solvents at a spin speed of 3000 RPM for 20 seconds. The coated wafer was heated to at 425° C. for 3 hours in an environment comprising 100% nitrous oxide. FTIR analysis after the heat treatment showed essentially all of the SiOH was removed. The coating thickness was 2863 angstroms and the refractive index was 1.456 at 405 nm.

What is claimed is:

1. A method of forming a silica-containing ceramic coating on a substrate comprising:

applying a silica precursor containing coating comprising hydrolyzed or partially hydrolyzed $R_nSi(OR)_{4-n}$ the substrate, in which each R is independently an aliphatic, alicyclic or aromatic substituent of 1–20 carbon atoms and n is 0–3; and heating the coated substrate in an atmosphere comprising nitrous oxide at a temperature sufficient to convert the silica precursor containing coating to a silica-containing ceramic coating.

2. The method of claim 1 wherein the silica precursor containing coating is applied to the substrate by a process which comprises coating the substrate with a solution comprising a solvent and the silica precursor and then evaporating the solvent.

3. The method of claim 2 wherein the substrate is an electronic device.

4. The method of claim 2 wherein said solution is coated onto the substrate by spray coating, dip coating, flow coating or spin coating.

5. The method of claim 2 wherein the coated substrate is heated at a temperature in the range of between about 100° C. and about 600° C. for between about 1 and 3 hours.

6. The method of claim 1 wherein the silica precursor material comprises hydrolyzed or partially hydrolyzed compounds of the formula $R_nSi(OR)_{4-n}$, in which each R is independently an aliphatic substituent of 1–4 carbon atoms and n is 0–1.

7. The method of claim 1 wherein the silica precursor containing coating also contains modifying ceramic oxide precursors comprising a compound containing an element selected from the group consisting of titanium, zirconium, aluminum, tantalum, vanadium, niobium, boron and phosphorous wherein the compound contains at least one hydrolyzable substituent selected from the group consisting of alkoxy or acyloxy and the compound is present in an amount such that the silica coating contains 0.1 to 30 percent by weight modifying ceramic oxide.

8. The method of claim 1 wherein the heating atmosphere also contains an inert gas.

9. The method of claim 1 wherein the heating atmosphere also contains an additional reactive gas.

10. The method of claim 1 wherein the heating atmosphere also contains moisture.

11. The method of claim 1 wherein the coated substrate is only exposed to the nitrous oxide during a portion of the heating.

\* \* \* \* \*